United States Patent [19]
Dahlberg

[11] Patent Number: 4,492,809
[45] Date of Patent: Jan. 8, 1985

[54] THERMOELECTRICAL ARRANGEMENT

[76] Inventor: Reinhard Dahlberg, Innere Bergstrasse 32, 7101 Flein, Fed. Rep. of Germany

[21] Appl. No.: 100,004

[22] Filed: Dec. 4, 1979

Related U.S. Application Data

[63] Continuation of Ser. No. 715,172, Aug. 17, 1976, abandoned.

[30] Foreign Application Priority Data

Oct. 22, 1975 [DE] Fed. Rep. of Germany ....... 2547262

[51] Int. Cl.³ ............................................. H01L 35/28
[52] U.S. Cl. .................................... 136/212; 136/203; 136/205; 136/208; 136/211; 136/225; 62/3
[58] Field of Search ............... 136/200, 203, 204, 205, 136/208, 211, 212, 225; 62/3

[56] References Cited

U.S. PATENT DOCUMENTS

| | | | |
|---|---|---|---|
| 434,587 | 8/1890 | Edison . | |
| 641,214 | 1/1900 | Matthias | 136/212 |
| 2,904,995 | 9/1959 | Obermaier | 136/225 |
| 2,984,077 | 5/1961 | Gaskill | 136/225 |
| 3,048,643 | 8/1962 | Winckler et al. | 136/225 |
| 3,261,720 | 7/1966 | McCormack | 136/205 |
| 3,524,771 | 8/1970 | Green | 136/203 |
| 3,707,429 | 12/1972 | Saunders | 136/205 |
| 3,943,553 | 3/1976 | Elfring et al. | 136/212 |
| 3,969,149 | 7/1976 | Thomas et al. | 136/225 |
| 4,006,039 | 2/1977 | Purdy | 136/225 |
| 4,036,665 | 7/1977 | Barr et al. | 136/225 |
| 4,049,469 | 9/1977 | Kolomoets et al. | 136/225 |
| 4,098,617 | 7/1978 | Lidorenko et al. | 136/225 |
| 4,251,290 | 2/1981 | Gomez | 136/225 |

Primary Examiner—Edward A. Miller
Attorney, Agent, or Firm—Spencer & Frank

[57] ABSTRACT

A thermoelectrical arrangement comprises a thermocouple element, each limb of which has a heat flow at one point such that a large temperature gradient is present and, as a result, the specific heat conduction at this point is reduced.

22 Claims, 8 Drawing Figures

THERMOELECTRICAL ARRANGEMENT

CROSS REFERENCE TO RELATED APPLICATION

This application is a continuation of Applicant's copending U.S. application Ser. No. 715,172 filed Aug. 17, 1976, and now abandoned.

BACKGROUND OF THE INVENTION

The invention relates to a thermoelectrical arrangement with improved efficiency for the purpose of converting heat into electrical energy and for the purpose of reversible electrical pumping of heat.

As is known, thermocouple elements as electrical generators for converting heat only reach efficiencies of a few percent. In addition, thermocouple elements have until today only been competitive as electrical heat pumps in very specific applications. This is chiefly because combining thermal and electrical properties of material, which limits the maximum efficiency possible of thermocouple elements, is still too bad in all the thermocouples available today. Even with the best thermoelectrical materials, which we know today (say doped $Si_{70}Ge_{30}$ crystals for generators or $Bi_2Te_3$ for heat pumps), the so-called "efficiency" (the quotient of the square of the thermoelectrical force divided by the ratio of thermal and electrical conductivity) only reaches the numerical value 1 when multiplied by the average operating temperature. This is the main reason for the fact that, at best, 10 to 20% of the Carnot efficiency may be reached with thermocouple elements. A very substantial increase in the efficiency would be necessary for the thermoelectrical effects to be used in large-scale technology.

A substantial increase in the thermoelectrical efficiency would scarcely be achieved by an improvement of known thermoelectrical materials given the present state of the art. Greater success is promised by exploiting and cultivating new physical effects in thermoelectrical arrangements.

New physical effects, either by means of an increase in the electrical conductivity or an increase in the thermoelectrical force or a reduction in the heat conductivity of thermoelectrical materials, could contribute to an increase in efficiency. An increase in the electrical conductivity is possible for example in very thin semiconductor and insulating layers by means of the tunnel effect relating to wave mechanics. An increase in the thermoelectrical force may take place as a result of electrons being "pulled along" by phonons in temperature gradients under special conditions (phone-drag effect), and a reduction in the thermal conductivity takes place with inelastic scattering of electrons at the lattice.

SUMMARY OF THE INVENTION

It is an object of the present invention to facilitate an improvement in the efficiency of thermocouple elements by using and cultivating new physical effects.

According to a first aspect of the invention, there is provided a thermoelectrical arrangement comprising a thermocouple element, limbs for said thermocouple element and means for providing heat flow at one point in each of said limbs with a large temperature gradient to reduce the specific heat conductivity at said one point.

According to a second aspect of the invention, there is provided a thermoelectrical arrangement having large temperature gradients, characterized in that, in each element limb of a thermocouple element, the heat flow flows across at least one point at such a large temperature gradient that the specific heat conductivity is reduced in this large temperature gradient.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
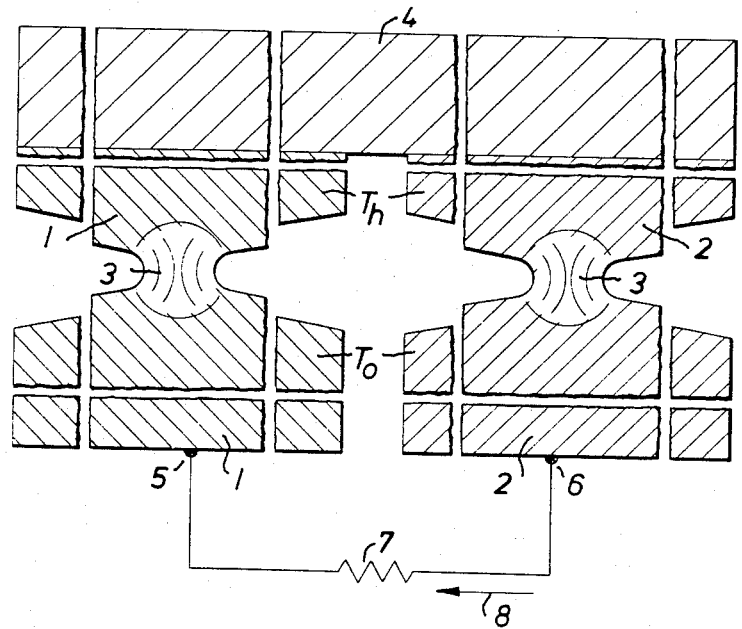
FIG. 1 shows an outline diagram of the invention with large stationary temperature gradients.

In a preferred embodiment of the invention, a thermoelectrical arrangement having large temperature gradients, is characterized in that in each element limb of a thermocouple element the heat flow flows at such a great temperature gradient across at least one point that as a result of inelastic scattering of electrons the specific heat conductivity in this large temperature gradient is reduced.

As in a solid, maximum temperature differences may be used of the order of magnitude of $10^3$ degrees; these large temperature gradients in the solid constitute large temperature differences over the smallest distances. While in conventional thermoelectric generators and heat pumps temperature gradients of $10^3$ to $10^4$ degrees per centimeter are scarcely reached, the thermoelectrical arrangement according to the invention can operate at temperature gradients $>10^4$ degrees per centimeter.

If the scattering of electrons at the lattice ions takes place elastically, then even large temperature differences in practice only influence the specific heat conductivity via the normal temperature dependence. As long as the greatest contribution of energy, which an electron is able to accept and emit in a temperature gradient in the mean between two impacts, is equal to k ⓗ at the most, then electron scattering remains elastic. Thus, k is the Boltzmann constant and ⓗ is the so-called characteristic or Debye temperature. The wiedemann-Franz-Lorenz law is also valid.

It is the theory of the present invention that with temperature gradients which are greater than $\bar{H}/\lambda$, the scattering of electrons in the direction of the temperature gradient is inelastic at the medium point, because the electrons accept or emit larger contributions of energy than $k\bar{H}$. Thus $\lambda$ is the so-called average free path length of the electrons. The inelastic scattering of electrons at the lattice ions in practice has no influence on the specific electrical conductivity. However, it does have an aggravating effect on the specific heat conductivity which is reduced by up to 5 orders of magnitude in the temperature gradient by the inelastic impacts of electrons with the lattice. The Wiedemann-Franz-Lorenz law for metals is no longer true in these critical temperature gradients because "hot" or "cold" electrons, i.e. electrons not located in balance with the lattice, govern events.

At temperatures around 1000° K. the values of $\bar{H}/\lambda$ for metals are in the order of magnitude of $10^7$–$10^8$ degrees per centimeter. With low temperatures the average free path length $\lambda$ becomes greater and the critical temperature gradient, in which the specific heat conductivity becomes smaller, may be smaller by one or several orders of magnitude, if the transition area is taken into consideration.

The material in a critical temperature gradient to a certain extent shows a new type of thermoelectrical material, the efficiency of which is determined by the thermoelectrical force (under the influence of extremely high temperature gradients), by the almost unchanged specific electrical conductivity and by the reduced specific heat conductivity. The product of efficiency times the average temperature may assume values of more than $10^3$ even for metals such as nickel and iron, for example.

With semiconductors and insulators, electrical field strengths of more than $10^5$ volts per centimeter may arise in critical temperature gradients as a result of the relatively large thermoelectrical forces, and this may bring about a reduction in the electrical resistance of these materials. In special circumstances, "drag" of the electrons occurs at high temperatures as a result of lattice oscillations and thus there is an increase in the thermoelectrical force of these materials—say in thin layers having large temperature gradients. If the thickness of the thin layers is sufficiently small, then an increase in the electrical cross-conductivity of the layers may also occur purely as a result of the tunnel effect relating to wave mechanics.

The large temperature gradients in embodiments of the invention may be stationary in the element limbs at sufficiently small points of connection or contact between bodies of different temperatures.

The large temperature gradients may however also be non-stationary in the element limbs.

As an example, large non-stationary temperature gradients may arise as a result of the surface absorption of intensive electromagnetic radiation (e.g. focused sunlight) or of ionized radiation (e.g. soft $\beta$-radiation).

Large temperature gradients may occur even at points of contact of bodies of different temperatures wherein. The points of contact vary relative to time—or to both time and space. Optimum conditions are achieved if the total electrical resistance and the total heat resistance of the thermoelectrical arrangement is determined substantially by the electrical resistances and the heat resistances in the zones or layers in which the large temperature gradients are present. Only in these zones or layers does a positive or negative "damping" of the non-balanced electrons take place and thus a reduction in the specific heat conductivity.

The large non-stationary temperature gradients at a contact point which may vary with time—or with time and space—may come about as a result of periodic contact of two bodies of different temperatures.

At least one of the two bodies may have a rotationally symmetrical shape.

The contact point which may vary with time—or with time and space—may be brought about by means of rolling, sliding or rubbing bodies of different temperatures against one another. Thus, despite non-stationary heat contact, a stationary electrical contact may be effected.

One of the two bodies of different temperatures may consist of plasma.

A further embodiment provides for one of the two bodies of different temperatures to be a liquid with good electrical conductivity, such as liquid or molten metal, a liquid metal alloy, a molten chemical compound or an electrolyte solution.

At least one of the two bodies of different temperatures may consist of metal, a metal alloy or a metallically conductive material.

According to a different important embodiment, at least one of the bodies of different temperatures may also comprise a p-conductive or n-conductive element semiconductor layer in monocrystalline or polycrystalline form.

However, at least one of the bodies of different temperatures may generally comprise a layer of a temperature-resistant chemical compound having positive or negative thermoelectric voltage, for example, an oxide, nitride, carbide, boride, chalcogenide, hydride, silicide, halide etc. As these layers may be so thin that they are able to be tunnelled through by electrons ($<1.10^{-6}$ cm) even high resistance semiconductors and insulators may be used successfully as thermocouples in the thermoelectric arrangement of the invention.

Moreover, there is provision for the thermoelectrical arrangement to be used as a direct energy converter in an a.c. energy converter. As a result of the impressed currents in an a.c. energy converter, the influence of the voltage-dependent tunnel resistances is reduced by absorbed gas layers at the contacts between the bodies of different temperatures. As a result, the negative influence of these skin resistances on the efficiency of the thermoelectrical arrangement is reduced.

Because of the facility for matching to the different practical requirements and because of the high efficiency of conversion of energy, the thermoelectrical arrangements of the invention may be used as thermoelectrical generators for power stations of all sizes with thermal, nuclear, or solar heating.

In combination with electrical motors they are suitable for drives of every type. They may also be used to advantage as heat pumps for reversible cooling, reversible heating and for air-conditioning.

Because of their high degree of efficiency, thermoelectrical arrangements of the invention are also suitable as heat pumps for thermoelectrical low-temperature cooling of superconductive arrangements.

Thermoelectrical arrangements of the invention may be switched in a manner known per se electrically in parallel and in series. A thermal parallel and series connection is also possible in cascade form.

Several specific embodiments will now be described:

EMBODIMENT 1

In FIG. 1, 1 is an iron foil of $5.10^{-2}$ cm thickness which has a central strip which is only $5.10^{-4}$ cm thick and $1.10^{-3}$ cm wide. This central strip has been penetrated from the right and from the left to form slits with the aid of an electron beam. The width of the slits amounts to $5.10^{-6}$ cm. The intermediate space between the slits has been evacuated. The ends of the slits lie opposite in the centre at a spacing of $7.10^{-6}$ cm. The nickel foil 2 has the same geometric dimensions as the iron foil 1. It is slit in the same manner as the iron foil 1. Above the slits, the iron foil 1 and the nickel foil 2, which are connected electrically together by means of the contact bridge 4, are held at a temperature $T_h = 1500°$ K. Below the slits the iron foil 1 and the nickel foil 2 are cooled to a temperature $T_o = 300°$ K. The temperature difference of $T_h - T_o = 1200$ degrees decreases in stationary manner in the connection pieces between slits in 1 and 2. The stationary temperature gradients 3 thus arising amount to approximately $4.2.10^8$ degrees per centimeter. As the Debye temperatures of iron and nickel are $\Theta_{Fe} = 519°$ K. and $\Theta_{Ni} = 472°$ K. and the average free path lengths are $\lambda_{Fe} = 2.2.10^{-6}$ cm and $\lambda_{Ni} = 1.33.10^{-6}$ cm, the ratio $\Theta/\lambda$ is approximately $2.4.10^8$ degrees per centimeter for iron and approximately $3.5.10^8$ degrees per centimeter for nickel. In the temperature gradients 3 of $4.2.10^8$ degrees per centimeter, electrons in the mean between two impacts must accept and emit higher maximum energy contributions than $k\Theta$ both in iron and in nickel. As a result of this, the scattering of the electrons becomes inelastic and the specific heat conduction in the region of large temperature gradients 3 drop by the factor $10^{-5}$ in 1 and in 2. As a result, the product of efficiency times temperature in this iron-nickel thermocouple element becomes approximately $10^3$ despite the small thermoelectric force of approximately 30 microvolts per degree. The maximum efficiency of this arrangement is at approximately 94% of the Carnot efficiency (of 80%) and thus amounts to 75% if all other losses as a result of radiation and conduction may be neglected. As a result of the integral thermoelectric voltage of approximately 36 millivolts, the electron flow 8 flows through the thermoelectrical arrangement across the contacts 5 and 6 and across the load resistor 7 which with 0.01 ohms takes the maximum electrical power of approximately 30 milliwatts.

EMBODIMENT 2

Figure 2:
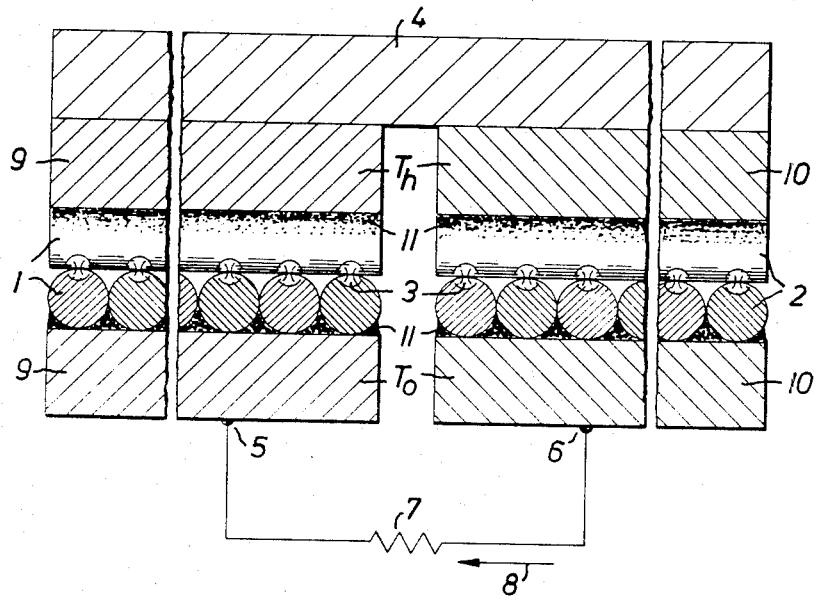
FIG. 2 shows an embodiment in accordance with the invention of the thermoelectrical arrangement having large stationary temperature gradients as a generator.

In FIG. 2, wires 1 having a diameter of $1.5.10^{-3}$ cm comprised of an alloy of 87.5% nickel + 12.5% chromium are placed adjacent two nickel plates 9 and are soldered on their underside to the respective nickel plate 9 with the aid of a hard solder 11. With a thickness of 2 cm, each nickel plate 9 has a length and width of 10 cm each, so that in total approximately 6600 wires 1 lie adjacent one another on each nickel plate 9 and are firmly soldered thereto. The two nickel plates 9 are laid one on top of the other with their wire sides (rotated by 90° relative to their normal surfaces so that the firmly soldered wires 1 lie one on top of the other in the form of a plurality of throttled intersections. By reducing and heating in a high vacuum, the surfaces of the wire are purified of all absorbed gases and are pressed together with such a pressure that approximately $44.10^6$ contact points have been formed between the wires 1 with an average circle diameter of $1.10^{-5}$ cm. In order that these pure spot resistances are maintained, the two nickel plates 9 having the wires 1 are held at high vacuum under adequate mechanical pressure. The nickel plates 10 in FIG. 2 are spread in a quite similar manner with wires 2, which have a diameter of $1.5.10^{-3}$ cm and comprise an alloy having 60% copper + 40% nickel. They are also assembled similarly and together also form approximately $44.10^6$ spot resistances having an average diameter of $1.10^{-5}$ cm. The upper plates 9 and 10 are electrically short-circuited via the contact bridge 4. They are located at the temperature $T_h = 1100°$ K. The lower plates 9 and 10 are fixed at the temperature $T_o = 300°$ K. The heat flow passes through the $44.10^6$ spot resistances in each thermoelectric limb 1 and 2 via temperature gradients 3 of approximately $2.10^8$ degrees per centimeter. Via the contacts 5 and 6, the electron flow 8 flows via the thermoelectrical arrangement and via the load resistor 7. In an electrical series connection of 1000 arrangements in accordance with FIG. 2, the electrical total voltage amounts to 40 volts and the maximum obtainable electrical power is 2 megawatts. With a power of 200 kilowatts the efficiency is approximately 60%.

EMBODIMENT 3

Figure 3:
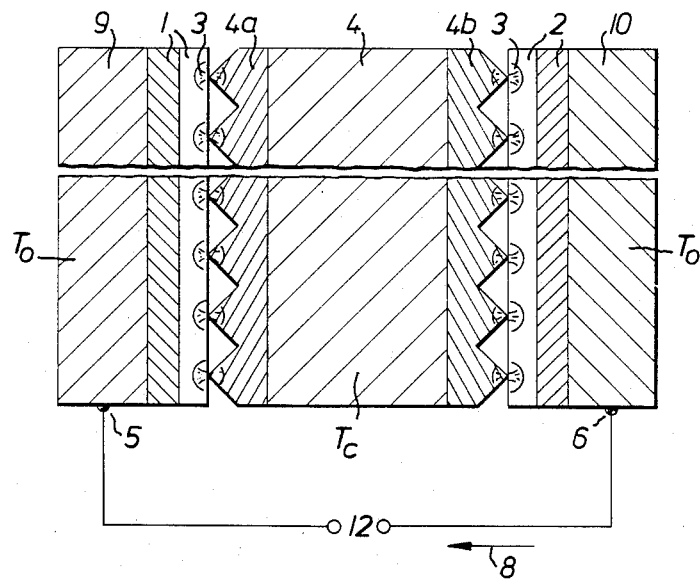
FIG. 3 shows an embodiment in accordance with the invention of the thermoelectrical arrangement with large stationary temperature gradients as a heat pump.

In FIG. 3, 1 is a p+-silicon monocrystal disc and 2 is a n+-silicon monocrystal disc. The discs 1 and 2 have a diameter of three inches and a thickness of $5.10^{-2}$ cm. On one side, they are alloyed without restriction on molybdenum plates 9 or 10 which also have a diameter of 3 inches. The non-alloyed sides of the silicon discs 1 and 2 are cut with V-shaped parallel-etched grooves so that two adjacent etched grooves and two adjacent ridges respectively have a spacing of $1.10^{-3}$ cm. In the same manner as the two silicon monocrystal discs 1 and 2, two molybdenum discs 4a and 4b of 3 inches diameter are cut on one side by V-shaped etched grooves so that two adjacent etched grooves and two adjacent ridges respectively have a spacing from one another of $1.10^{-3}$ cm. The silicon disc 1 and the molybdenum disc 4a as well as the silicon disc 2 and the molybdenum disc 4b are placed with their etched surfaces on top of one another under pressure (rotated by 90°), so that the ridges made of silicon form approximately $44.10^6$ contact surfaces with the ridges made of molybdenum. As a result of a short baking process in the high vacuum at approximately 1200° C., pure spot resistances with an average diameter of $2.10^{-5}$ cm are formed from these contact surfaces. The molybdenum discs 4a and 4b are connected together by the molybdenum bridge 4. The electron flow 8 passes out of the d.c. source 12 through the arrangement via the electrical connections 5 and 6 at the two outer molybdenum plates 9 and 10 (fixed at the temperature $T_o = 300°$ K.). Heat is absorbed in a very thin layer in 1 and in 4b as a result of the Peltier effect at the electron transitions of 1 to 4a and of 4b to 2, and at these transitions the large temperature gradients 3 are formed. The thermoelectrical arrangement has an internal resistance of $1.10^{-5}$ ohms. With the maximum cooling flow 8 of $10^4$ amperes, the heat power aborbed when the flow 8 passes into the temperature gradients 3 is 1 kilowatt. Without supplying heat from outside, a cooling temperature $T_o < 20°$ K. is reached at 4.

Figure 4:
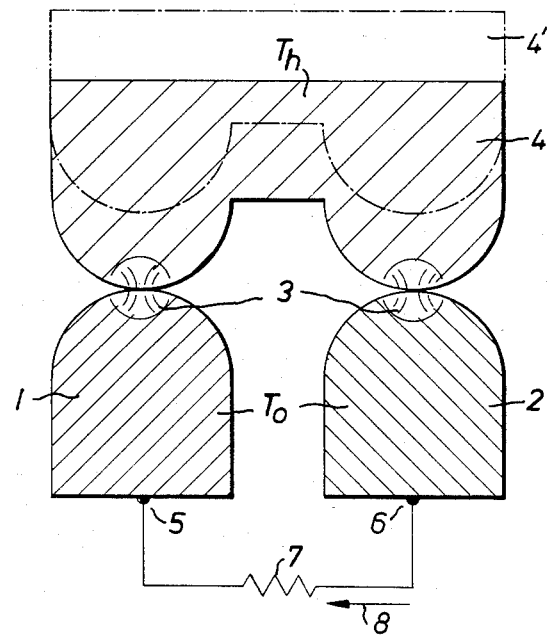
FIG. 4 shows an outline diagram of the invention with large non-stationary temperature gradients.

Of particular interest within the framework of the invention are large non-stationary temperature gradients. They exist in fact only for a short time ($<10^2$ seconds) at one point, but they are not bound to small surfaces or contact points. FIG. 4 shows an outline diagram of an embodiment of the invention with large non-stationary temperature gradients.

EMBODIMENT 4

In FIG. 4, 1 is an iron pin of 0.5 cm diameter and 2 is a cobalt pin of the same diameter. Both pins 1 and 2 are fixed at the temperature $T_o=300°$ K. 4 is a movable contact bridge which consists of tungsten and is heated to a temperature of 1900° K. The movable contact bridge 4 performs vertical oscillations at a frequency of 100 Hertz between the extreme positions 4 and 4'. In position 4, both the iron pin 1 and the cobalt pin 2 each have a point of contact with the contact bridge 4. As the arrangement is located in the high vacuum and is heated carefully, each point of contact corresponds to a spot resistance with a diameter of $1.10^{-3}$ cm on average. These points of contact exist 100 times per second and last less than one millisecond. At the beginning of each contact between the iron pin 1 and the cobalt pin 2 with the bridge 4, the complete temperature difference $T_h - T_o = 1600$ degrees is applied momentarily at the point of contact. This causes the complete temperature difference to drop for a short period at layers which have a thickness of only a few medium free path lengths. As a result, the large temperature gradients 3 are formed for a short period both in the iron pin 1 and in the cobalt pin 2 as well as in the contact bridge 4. The iron pin 1, the cobalt pin 2 and the contact bridge 4 thus reach a temperature of approximately 1100° K. at the points of contact. As a result of the thermoelectric voltage between iron and cobalt, a pulsating electron flow 8 of 100 Hertz passes across the contacts 5 and 6 through the spot resistances of the thermoelectrical arrangement and the load resistor 7. At a Carnot efficiency of approximately 72% the maximum efficiency of the arrangement is only approximately 37%, because the total of the spot resistances of the contact points is greater by the factor $10^2$ than the sum of the electrical resistances in the layers at the large temperature gradients 3. The load resistance 7 can take a maximum of some milliwatts power across the pulsating electron flow.

EMBODIMENT 5

Figure 5:
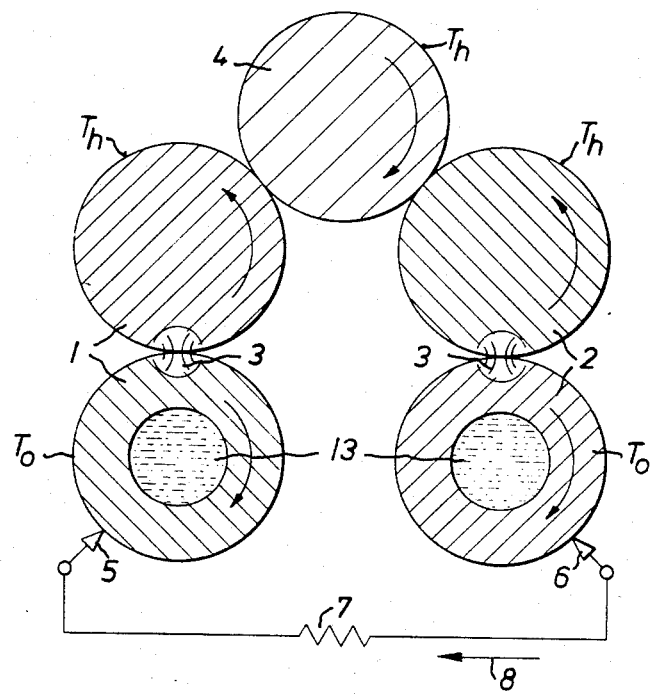
FIG. 5 shows an embodiment in accordance with the invention of the thermoelectrical arrangement having large non-stationary temperature gradients between bodies of different temperatures of rotationally symmetrical shape as a generator.

FIG. 5 shows an embodiment of the invention with large non-stationary temperature gradients between bodies of different temperatures, having a rotationally symmetrical shape. There are two cylinders 1 made of iron, of which one is fixed via a water-cooling system 13 at a temperature $T_o=300°$ K., while the other iron cylinder 1 is heated to a temperature $T_h=1500°$ K. Identified by reference numeral 2 are two iron cylinders which are coated with a $5.10^{-2}$ cm thick nickel layer. They have the same temperatures $T_h$ and $T_o$ as the iron cylinders 1. The hot cylinders 1 and 2 are short circuited by an iron cylinder 4 which acts as a hot contact bridge 4 between 1 and 2. All the cylinders 1, 2 and 4 have an outer diameter of 50 cm and a width of 50 cm. They ride on one another in high vacuum at a rotational speed of one revolution per second.

The moving surfaces of the cylinders 1 and 2 are so constructed that on average approximately $5.10^6$ spot resistances with an average diameter of $1.10^{-4}$ cm are located on the contact surfaces between the cylinders 1 of different temperatures and the cylinders 2 of different temperatures. The total resistance of all electrical spot resistances is greater by a factor of 10 than the sum of the electrical resistances of all layers having large temperature gradients 3. Despite this, the maximum efficiency of the generator according to FIG. 5 is 65%. Via the electron flow 8, which flows across the sliding contacts 5 and 6 to the load 7, a maximum of approximately 20 kilowatts of electrical power may be obtained with a voltage of only 40 millivolts.

EMBODIMENT 6

Figure 6:
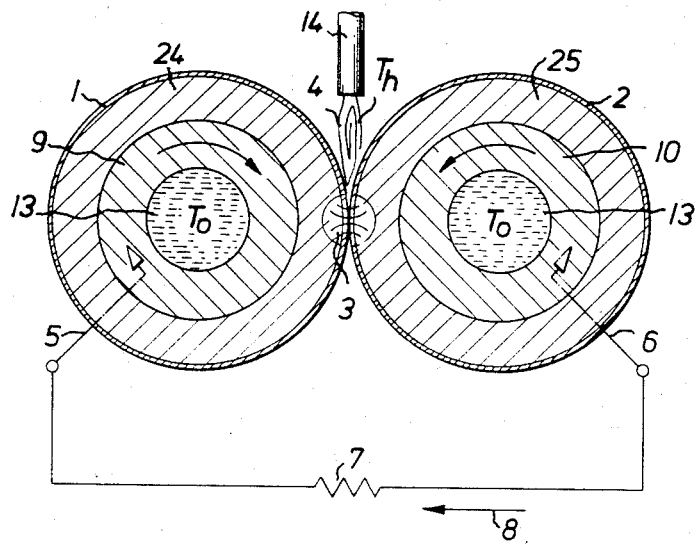
FIG. 6 shows an embodiment in accordance with the invention of the thermoelectrical arrangement as a generator having large non-stationary temperature gradients using a plasma contact bridge.

FIG. 6 shows schematically an embodiment of the invention in which one of the bodies of different temperatures consists of plasma. 9 and 10 in FIG. 6 are hollow copper cylinders provided with a platinum coating which are held at a temperature of $T_o=300°$ K. by means of an axial water-cooling system. The platinum coating of the cylinder 9 contains a few percent of thorium, which has moved partially to the surface and has formed a $1.10^{-6}$ cm thick layer 1 made of $ThO_2$ there. The platinum coating of the cylinder 10 contains a few percent magnesium which has also moved partially to the surface and has formed a $2.10^{-6}$ cm thick layer 2 made of MgO there. Both cylinders 9 and 10 have an outer diameter of one meter and a width of one meter. They rotate at two revolutions per second and are so close to one another that their surfaces do not quite touch. From a wide nozzle 14, an oxyacetylene flame 4 flows directly on to the contact line of the two layers 1 and 2. As the flame 4 has a temperature of approximately 4000° K., the surfaces of 1 and 2 are heated in the region of their contact line to 1800° K. The electrical resistance of the arrangement of $2.10^{-5}$ ohms is formed practically only by the transition resistance between 1 and 2 via the plasma 4. The idling voltage at the sliding contacts 5 and 6 amounts to 2 volts and a maximum of 50 kilowatts of electrical power may be obtained by the load. The maximum efficiency amounts to over 50%.

In a different example of embodiment according to FIG. 6, the two cylinders 9 and 10 rotate so close to one another that they ride on one another and the layers 1 and 2 have direct electrical contact with one another. Instead of the oxyacetylene flame 4, the line of contact of the two layers is heated to 2100° K. by means of focused solar radiation at a power density of $10^3$ watts per square centimeter, while the large non-stationary temperature gradients 3 are formed in 1 and 2.

EMBODIMENT 7

Figure 7:
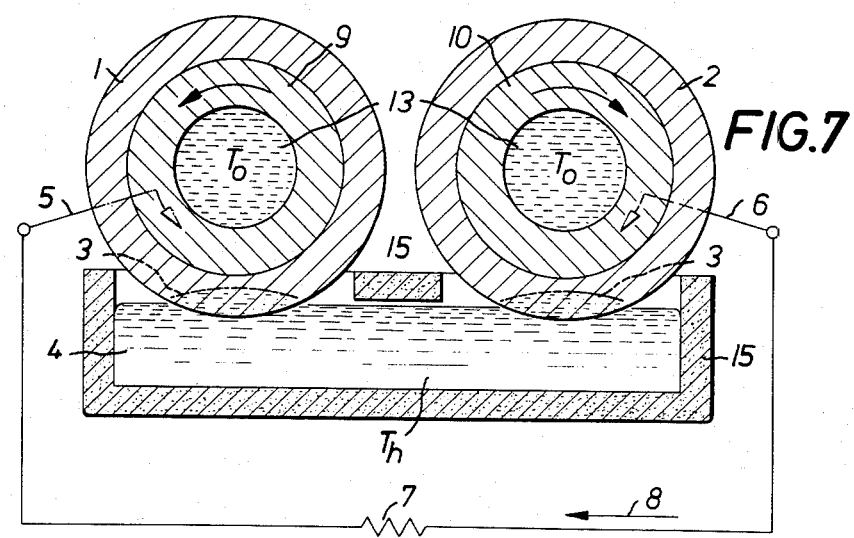
FIG. 7 shows an embodiment in accordance with the invention of the thermoelectrical arrangement having large non-stationary temperature gradients as a heat pump.

FIG. 7 shows schematically an embodiment of the invention in which one of the bodies of different temperatures comprises liquid metal. 9 is a molybdenum hollow cylinder having an outer diameter of 50 cm and a wall thickness and width of 1 cm. It has a p-doped SiC layer 1 on its outer surfaces of $1.10^{-4}$ cm thickness having a specific electrical resistance of 0.1 $\Omega$cm. 10 is a molybdenum hollow cylinder having an outer diameter of 50 cm and a wall thickness width of 1 cm. It has an n-doped SiC layer 2 of $1.10^{-4}$ cm thickness at its outer surfaces having a specific electrical resistance of 0.1 $\Omega$cm. The cylinder 9 and 10 are held at a temperature $T_o$ 300° K. by the water-cooling equipment 13. They rotate at a speed of 20 revolutions per second. Both cylinders 9 and 10 plunge (under protective gas) into a common bath 4 made of liquid silver, which is located in a ceramic container 15. The ceramic container 15 is heated by focussed solar radiation so that the liquid silver 4 has a temperature of 1600° K.

The cylinders 9 and 10 plunge so deeply into the silver bath that during rotation approximately 2 cm² of layers 1 and 2 are moistened by the silver bath 2. The layers 1 and 2 are heated at the points having large temperature gradients 3 up to approximately 1300° K. In total, 400 arrangements as in FIG. 7 are placed one behind the other in a "focal line" 10 metres long of a semi-cylindrical solar reflector and are connected in series. They give an idling voltage of 200 volts between the contact 5 on the first cylinder and the contact 6 on the last cylinder 10 of the arrangement and they have a total internal resistance of $1.10^{-2}$ ohms. The maximum power emission of this thermoelectrical solar generator is 1 megawatt. When obtaining an electrical power of 100 kilowatts, the efficiency of conversion of the absorbed solar radiation is 45%. The required collecting area for the solar radiation is thus approximately $10 \times 40$ m².

EMBODIMENT 8

Figure 8:
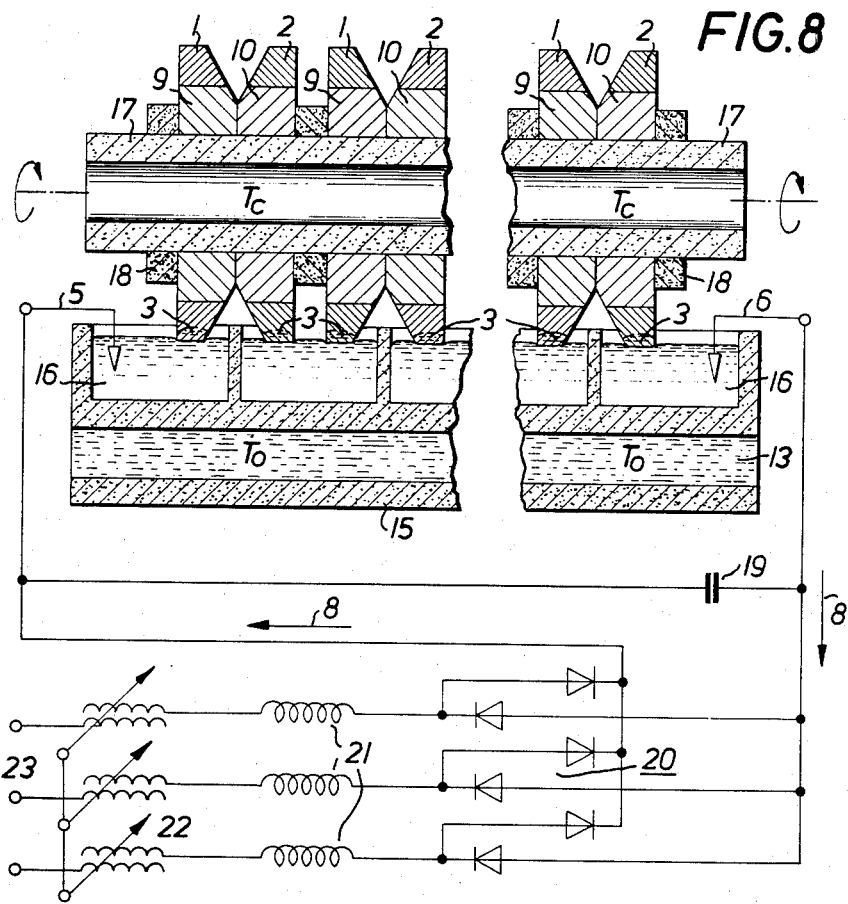
FIG. 8 shows an embodiment in accordance with the invention of the thermoelectrical arrangement having large temperature gradients in a.c. energy converter as a generator.

FIG. 8 shows schematically an embodiment of the invention as a thermoelectrical heat pump. 9 and 10 in FIG. 8 are tungsten rings having an outer diameter of 15 cm and a width of 0.25 cm, which are pulled onto a ceramic pipe 17 having an outer diameter of 13 cm, with which they have a good heat transfer. The outer surface of the tungsten ring 9 is coated with a $1.10^{-4}$ cm thick p+—conductive silicon layer 1 which has a specific electrical resistance of $1.10^{-3}$ Ωcm. The outer surface of the tungsten ring 10 is coated with a n+—conductive silicon layer 2 of the same thickness and having the same specific resistance. In total, 100 pairs of rings 9 and 10, which are soldered together, are located on a ceramics pipe 17 and are separated electrically by the ceramics 18 having an outer diameter of 14 cm and a width of 0.25 cm. The ceramics pipe 17 rotates at 5 revolutions per second about its longitudinal axis. Thus, each ring 9 and 10 plunges so deeply into an electrically insulated mercury bath 16 that the layers 1 and 2 touch the mercury with a surface of $1.10^{-2}$ cm² each. On these surfaces the non-stationary large temperature gradients 3 are formed as a result of the Peltier effect. The mercury baths 16 are located in a ceramics container 15 which is held by the water-cooling equipment 13 at a temperature of $T_o = 300°$ K. In the mercury bath 16 of the first tungsten ring 9 and in the mercury bath 16 of the last tungsten ring 10, are arranged the electrical contacts 5 and 6 across which the arrangement is connected to an a.c. energy converter. It comprises connections 23 for a three-phase 50 Hertz a.c. current to which the controllable three-phase current transformer 22 is attached. It passes a voltage across the chokes 21 and the three-phase rectifier 20 as a pulsating d.c. voltage across the contacts 5 and 6 to the thermoelectrical arrangement. The internal resistance of the thermoelectrical arrangement is 0.2 ohms. The a.c. resistance of the chokes 21 is 4 ohms. In addition, this apparent impedance which is greater by a factor of 20 and which is in the a.c. current circuit also determines the d.c. current 8 (smoothed with the aid of the capacitor 19) through the thermoelectrical arrangement. The d.c. current 8 flows almost as an "impressed current" through the arrangement whereby the influence of disruptive contact resistances is largely eliminated. With an a.c. voltage of 400 volts, the maximum current of 100 amperes flows through the thermoelectrical arrangement wherein without supply of heat from outside the ceramics pipe 17 is cooled down to a temperature of $T_c < 50°$ K.

It will be understood that the above description of the present invention is susceptible to various modification changes and adaptations.

What is claimed is:

1. A thermoelectrical arrangement having large temperature gradients comprising a thermocouple having two thermolimbs including respectively different thermocouple materials and a bridging member which pressure contacts each of said thermolimbs at a respective plurality of points forming a respective planar array; and means for providing a temperature difference between said thermolimbs and said bridge member which temperature difference is sufficiently great to cause large temperature gradients greater than $10^4$ degrees per centimeter in the regions of said plurality of points of contact whereby the specific heat conductivity at said regions is reduced as a result of inelastic scattering of electrons in said temperature gradients.

2. A thermoelectrical arrangement as defined in claim 1 wherein said contact points between said thermolimbs and said bridge member are stationary and each have a contact radius of less than $10^{-3}$ centimeter.

3. A thermoelectrical arrangement as defined in claim 1 wherein the space surrounding said two thermolimbs and said bridging member is evacuated.

4. A thermoelectrical arrangement including a plurality of thermocouples as defined in claim 1 electrically and thermally connected in parallel with each other.

5. A thermoelectrical arrangement as defined in claim 1 wherein: each of said separate thermolimbs comprises a plate-like member having a structure of alternating parallelly extending ridges and grooves on one surface of same; the respective surfaces of said bridge member which contact said thermolimbs are each provided with a structure of alternatingly parallelly extending grooves and ridges; and said structured surfaces of said separate thermolimbs and the associated said structured surfaces of said bridge member are disposed facing one another with said ridges of said thermolimbs contacting said ridges of the respective surfaces of said bridge member and being oriented so that the longitudinal axes of said ridges of said thermolimbs are parallel but rotated with respect to the longitudinal axes of the associated said ridges of said bridge member, whereby a planar array of point contacts is provided.

6. A thermoelectrical arrangement as defined in claim 5 wherein: each of said plate-like members comprises a metal plate having a disc of semiconductor material of one conductivity type on a major surface of same and with said one surface having said structure of alternatingly parallelly-extending ridges and grooves being the outer surface of said semiconductor material; the semiconductor material of the two said plate-like members are of opposite conductivity types; and said bridge member consists of metal.

7. A thermoelectric arrangement as defined in claim 6 wherein said structured surfaces of said plate-like members are rotated by 90° with respect to the respective contacted structured surfaces of said bridge member.

8. A thermoelectric arrangement as defined in claim 6 wherein said structure of alternatingly parallelly-extending ridges and grooves is formed by V-shaped grooves provided in the associated said surface of the respective said member.

9. A thermoelectric arrangement as defined in claim 8 wherein the distance between adjacent ridges is $10^{-3}$ cm.

10. A thermoelectrical arrangement as defined in claim 1 wherein each of said limbs includes a material selected from the group consisting of a metal, a metal alloy and a conductive chemical compound.

11. A thermoelectrical arrangement as defined in claim 1 wherein each of said thermolimbs includes a semiconductor material selected from the group consisting of a p-conductive semiconductor element, n-conductive semiconductor element, a p-conductive semiconductor compound and a n-conductive semiconductive compound.

12. A thermoelectrical arrangement as defined in claim 11, wherein said semiconductor material is monocrystalline.

13. A thermoelectrical arrangement as defined in claim 11, wherein said semiconductor material is polycrystalline.

14. A thermoelectrical arrangement comprising a thermocouple element having a plurality of limbs connected by a bridging member and with each said limb being of a different thermocouple material and each said limb being formed of two separate members which pressure contact one another at a plurality of contact points forming a respective planar array, said contact points being sufficiently small so as to cause temperature gradients greater than $10^4$ degrees per centimeter in the regions of said contact points when heat flows through said contact points when said two members of each said limb are at different temperatures whereby the specific heat conductivity at said regions is reduced as a result of inelastic scattering of electrons in said temperature gradients.

15. A thermoelectric arrangement as defined in claim 14 wherein said contact points have an average contact diameter of $10^{-5}$ cm.

16. A thermoelectrical arrangement as defined in claim 14 wherein said two separate members of each said limb comprise a first plurality of parallel small diameter wires fastened on a surface of a first metal plate, and a second plurality of parallel small diameter wires, of the same material as said first plurality of wires, fastened on a surface of a second metal plate; and wherein, in each said limb, said first and second plates are disposed one above the other with said first and second plurality of wires contacting one another, and being oriented so that the longitudinal axes of said first plurality of wires are parallel but rotated by 90° with respect to the longitudinal axes of said second plurality of wires.

17. A thermoelectric arrangement as defined in claim 16 wherein each of said wires has a diameter of approximately $1.5 \times 10^{-3}$ cm.

18. A thermoelectric arrangement as defined in claim 16 wherein said bridge member and each of said plates is formed of nickel, wherein said wires of one limb are formed of a nickel chromium alloy and said wires of the other limb are formed of copper-nickel alloy.

19. A thermoelectrical arrangement comprising a thermocouple element having a plurality of limbs of different thermocouple materials, and a bridge member pressure contacting each of said limbs at a respective plurality of contact points forming a respective planar array, said contact points being sufficiently small so as to cause temperature gradients greater than $10^4$ degrees per centimeter in the regions of said contact points when heat flows through said contact points when said limbs are at a different temperature then said bridge member whereby the specific heat conductivity at said regions is reduced as a result of inelastic scattering of electrons in said temperature gradients.

20. A thermoelectrical arrangement as defined in claim 19 wherein said contact points have an average contact diameter of $2 \times 10^{-5}$ cm.

21. A thermoelectrical arrangement as defined in claim 19 wherein: each of said limbs comprises a plate-like member having a structure of alternating parallelly extending ridges and grooves on one surface of same; the respective surfaces of said bridge member which contact said bodies are each provided with a structure of alternatingly parallelly extending grooves and ridges; and said structured surfaces of said limbs and the associated said structured surfaces of said bridge member are disposed facing one another with said ridges of said limbs contacting said ridges of the respective surfaces of said bridge member and being oriented so that the longitudinal axes of said ridges of said limbs are parallel but rotated with respect to the longitudinal axes of the associated said ridges of said bridge member, whereby a planar array of point contact is provided.

22. A thermoelectrical arrangement as defined in claim 21 wherein: each of said plate-like members comprises a metal plate having a disc of semiconductor material of one conductivity type on a major surface of same and with said one surface having said structure of alternatingly parallelly-extending ridges and grooves being the outer surface of said semiconductor material; the semiconductor material of the two said plate-like members are of opposite conductivity types; and said bridge member consists of metal.

* * * * *